United States Patent [19]
Brehmer et al.

[11] Patent Number: 5,893,028
[45] Date of Patent: Apr. 6, 1999

[54] INTERMEDIATE FREQUENCY GAIN STAGE WITH RECTIFIER

[75] Inventors: Geoffrey E. Brehmer, Lexington; Joe W. Peterson, Austin, both of Tex.

[73] Assignee: Advanced Micro Devices, Inc., Sunnyvale, Calif.

[21] Appl. No.: 780,691

[22] Filed: Jan. 8, 1997

[51] Int. Cl.$^6$ .................................................. H04B 1/26
[52] U.S. Cl. .......................................... 455/313; 455/341
[58] Field of Search .................................. 455/226.2, 313, 455/334, 341, 323, 127, 196.1; 330/253, 260, 257, 306; 327/538, 543; 323/315

[56] References Cited

U.S. PATENT DOCUMENTS

| | | | |
|---|---|---|---|
| 4,926,139 | 5/1990 | Anderson et al. | 330/306 |
| 5,448,770 | 9/1995 | Hietala et al. | 455/127 |
| 5,564,089 | 10/1996 | Barrett, Jr. | 455/196.1 |

*Primary Examiner*—Thanh Cong Le
*Assistant Examiner*—Marsha D. Banks-Harold
*Attorney, Agent, or Firm*—Conley, Rose & Tayon, PC; B. Noel Kivlin

[57] ABSTRACT

An intermediate frequency gain and rectifying stage for an IF system is implemented with a high swing folded-casecode structure terminated into a current-mirror load. The signal-path outputs are derived from the current-mirror loads, and the rectification and current-limiting RSSI functions are performed with two additional constant-current sources and two additional current-mirror loads. One load current from one leg or current path of the signal-path gain-stage is mirrored into a constant-current source and a second current-mirror structure. A second leg or current path of the signal-path gain-stage is likewise mirrored into yet another constant-current source and another current-mirror structure. When the input signal is not present, the load currents in the signal-path gain-stage are equal and the rectified output signal on an output node IOUT is constant or set to zero. With a differential input signal present, the load currents in the signal-path gain-stage produce a plus delta-current and minus delta-current. The plus delta-current, which represents a difference between the current in one of the legs of the signal-path gain-stage and the current of a corresponding constant current source, is mirrored to generate the RSSI current output signal at the IOUT node. Likewise, during the negative-half input-cycle the signal-path load currents are again mirrored and only the plus delta-load-current is rectified and output on the output node IOUT.

9 Claims, 8 Drawing Sheets

INTERMEDIATE FREQUENCY GAIN STAGE WITH RECTIFIER

BACKGROUND OF THE INVENTION

1. Field of the Invention

The present invention relates to radio frequency and intermediate frequency communications systems, and more particularly to intermediate frequency gain stage circuitry and rectifying circuitry of a radio frequency system receiver.

2. Description of the Related Art

With the dramatic advances of deep submicron CMOS technology, the ability to integrate more and more radio functions into one piece of silicon is becoming possible. Radio functions within integrated circuits are generally partitioned into either an RF (radio frequency) chip and an IF (intermediate frequency) chip, or are partitioned into independent transmitter and receiver chips. Traditionally, RF and IF chips have been implemented in a BiCMOS, Bipolar, or Gallium Arsenide (GA) technology. However, more recently, these functions are being implemented in CMOS technology.

FIG. 1 is a block diagram that illustrates a typical subsection of an IF system. The basic function of the subsection is to provide large amounts of gain between the differential inputs, IM and IP, and differential outputs, OP and OM, and to produce a linear output on node IOUT with logarithmic changes of power on the inputs IP and IM. An IF signal path is therefore formed between the differential inputs IM and IP and differential outputs OP and OM. The function of the IF signal path is to prepare the relatively low amplitude incoming signal for demodulation by giving it many decibels of gain and filtering. The linear output on node IOUT is used to generate a receive signal strength indicator (RSSI) signal which is typically employed for choosing an incoming channel that has the highest strength and yields the optimum signal to noise performance for the receiver. The voltage range, or power range, of the incoming signal varies so greatly that a logarithmic RSSI is required to function within the limited voltage range of integrated circuits.

The IF signal path of the limiter includes a plurality of serially coupled gain stages 11A–11E. Each limiter stage 11 has a fixed amount of gain, such as 12 db, and a limited voltage swing, such as 0.4 volts. As the input power increases on the inputs IP and IM, the last limiter stage 11E will reach clipping first. Likewise, limiter stages 11D, 11C, 11B and 11A will each reach a clipping level in order in intervals of the interstage gain. The intent of the IF signal path is to produce a voltage-limited square-wave like output signal on outputs OP and OM that can be converted to digital logic levels with a simple comparator.

The circuitry used to generate the linear output on node IOUT includes a plurality of RSSI rectifying stages 13A–13E. Each RSSI rectifying stage 13 operates similar to the gain stages II in the IF signal path, but outputs a limited rectified current at intervals of the interstage gain. Rectifying stage 13E is the first output stage to output a limited rectified current as a function of the input power, and rectifying stages 13D, 13C, 13B and 13A each follow with corresponding increases in input power. By terminating node IOUT into a resistive load, the rectified current is converted into a rectified voltage. The effect of cascading multiple current-limited rectifying stages creates a piecewise linear approximation of a logarithmic function. FIG. 2 depicts the RSSI function as a function of input power and FIG. 3 illustrates the transient response on the last three gain stages 11C, 11D and 11E of the IF signal path for a fixed sinusoidal input.

FIGS. 4 and 5 are schematic diagrams that illustrate circuitry for implementing each gain stage and each rectifying stage 13, respectively, of the IF system of FIG. 1. The limiter stage 11 of FIG. 4 is a simple differential-pair circuit with a diode-connected load, where the input pair transistors MN1 and MN2 are of the same type as the load transistors MN3 and MN4. The basic idea of this architecture is to get a voltage gain relationship from the gm of transistors MN1 and MN2 to the gm of transistors MN3 and MN4. This performs well from an AC perspective but has limitations with respect to the common-mode voltage. In order to get more gain from the circuit, the size of transistors MN3 and MN4 must be decreased or the current through transistors MN1 and MN2 must be increased. By increasing the tail current in transistor MN0, the current through transistors MN1 and MN2 may be increased, but the gain will not change appreciably because the same current is in the loads MN3 and MN4. Hence, the best way to increase gain is to increase the ratio of transistor size MN1 and MN2 with respect to the size of transistors MN3 and MN4. This creates another difficulty in that the input-pair transistors MN1 and MN2 desirably operate with a common mode voltage closer to the supply voltage AVCC. However, as transistors MN3 and MN4 are decreased in size the drain to source voltage increases and forces transistors MN1 and MN2 to operate with a common mode voltage closer to a VSS. The effects of input and output common mode voltage can best be seen by cascading multiple gain stages as illustrated in FIG. 1. This results in design tradeoffs between gain and common-mode operation, thus create difficulties for a manufacturable circuit.

The rectifying circuit of FIG. 5 performs the current rectification and limiting function of each rectifying stage 13 of FIG. 1. When the input signal is not present, the circuit produces a constant output current, Ir, which is proportional to the differential tail current "I". The tail-current I is divided between the first differential pair of transistors MN5 and MN6 and further divided between the second differential pair formed with transistors MN1, MN2, MN3, and MN4. The p-channel diode-connected transistors MP1 and MP2 define the loads for the second differential pair devices. The use of two differential pair circuits and the redirection of current for positive and negative input signals create the rectified output signal on IOUT. Lastly, the implementation of using one common tail-current elegantly produces a current-limited output as well. This circuit can perform adequately, but it is difficult to bias both sets of input pair devices, and the fact that it uses a completely different gain stage from the IF signal path induces potential problems. Furthermore, this circuit does not use any casecode structures. Thus, current mirroring mismatches and reduced power supply rejection can lead to reduction in the overall system performance.

SUMMARY OF THE INVENTION

The problems outlined above are in large part solved by an intermediate frequency gain and rectifying stage for an IF system in accordance with the present invention. In one embodiment, an amplifier section of the gain rectifying stage is implemented with a high swing folded-casecode structure terminated into a current-mirror load. The signal-path outputs are derived from the current-mirror loads, and the rectification and current-limiting RSSI functions are performed with two additional constant-current sources and two additional current-mirror loads. One load current from one leg or current path of the signal-path gain-stage is mirrored into a constant-current source and a second current-mirror structure. A second leg or current path of the signal-path gain-stage is likewise mirrored into yet another constant-current source and another current-mirror structure. When the input signal is not present, the load currents in the signal-path gain-stage are equal and the rectified output signal on an output node IOUT is constant or set to zero. With a differential input signal present, the load currents in the signal-path gain-stage produce a plus delta-current and minus delta-current. The plus delta-current, which represents a difference between the current in one of the legs of the signal-path gain-stage and the current of a corresponding constant current source, is mirrored to generate the RSSI current output signal at the IOUT node. Likewise, during the negative-half input-cycle the signal-path load currents are again mirrored and only the plus delta-load-current is rectified and output on node IOUT. An IF system employing an IF gain-stage and rectifier circuit in accordance with the invention may accommodate simplified construction, lower power, reduce silicon die area. The IF gain-stage and rectifier circuit may further allow separation of the differential current from load current hence creating more flexibility with gain and common-mode operation, and may eliminate gain variation problems between the signal path and the RSSI functional path.

Broadly speaking, the present invention contemplates an intermediate frequency circuit comprising a signal amplifier stage for amplifying a differential input signal including a first current path and a second current path whereby a differential output signal is derived from a respective node along each of the first and second current paths. The signal amplifier stage further includes a first current mirror configured to generate a first mirrored signal having a current proportional to a current of the first current path, and a second current mirror configured to generate a second mirrored signal having a current proportional to a current of the second current path. The intermediate frequency circuit further comprises a rectifying current mirroring stage for generating a rectified output signal proportional to an amplitude of the differential input signal. The rectifying current mirroring stage includes a first constant current source for generating a first constant current, a third current mirror configured to generate a third mirrored signal having a magnitude proportional to a difference between the first mirrored signal and the first constant current, a second constant current source for generating a second constant current, and a fourth current mirror configured to generate a fourth mirrored signal having a magnitude proportional to a difference between the second mirrored signal and the second constant current. The rectified output signal of the rectifying current mirroring stage is derived by combining the third mirrored signal and the fourth mirrored signal.

The invention further contemplates method for amplifying a differential input signal and for generating a rectified output current signal having a magnitude proportional to an amplitude of the differential input signal. The method comprises generating a differential output signal by modulating a first current signal through a first current path and a second current signal through a second current path depending upon the differential input signal, mirroring the first current signal to generate a first mirrored signal, and mirroring the second current signal to generate a second mirrored signal. The method further comprises generating a first constant current and generating a third mirrored signal by mirroring a current equal to a difference between the first mirrored signal and the first constant current. The method finally comprises generating a second constant current and generating a fourth mirrored signal which is proportional to a difference between the second mirrored signal and the second constant current.

BRIEF DESCRIPTION OF THE DRAWINGS

Other objects and advantages of the invention will become apparent upon reading the following detailed description and upon reference to the accompanying drawings in which.

Figure 1:
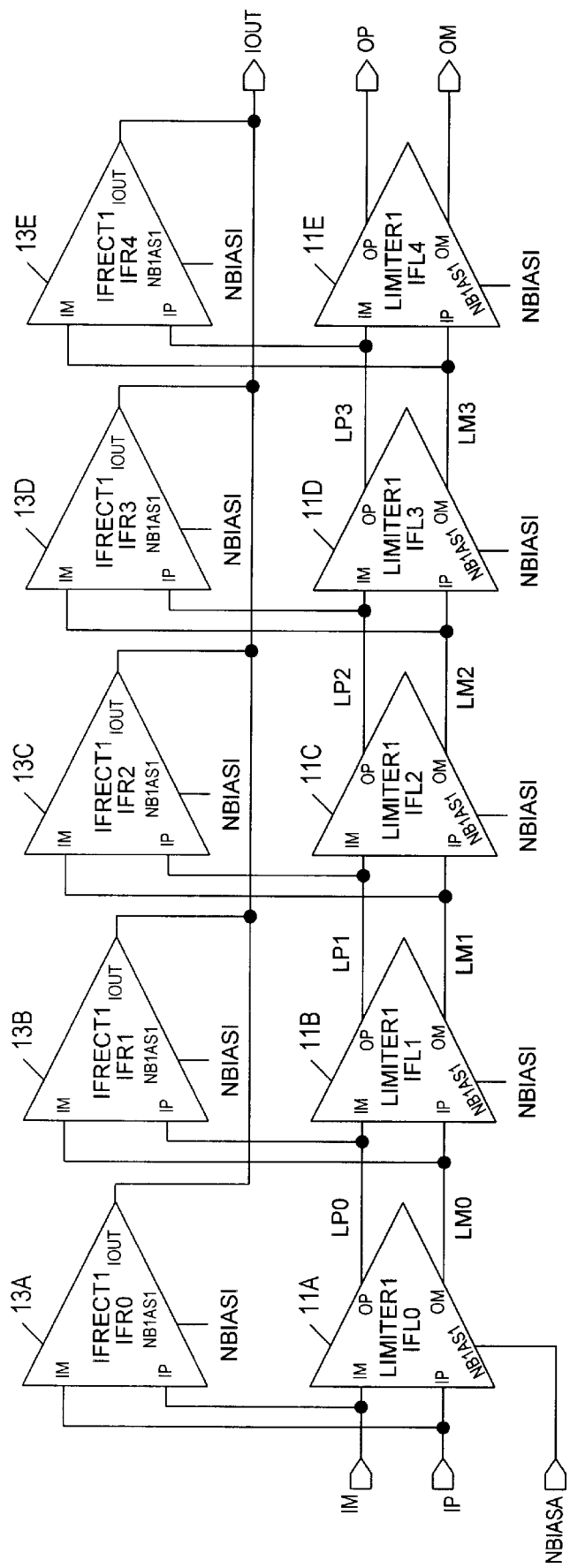
FIG. 1 is a block diagram that illustrates a typical subsection of an IF system.
Figure 2:
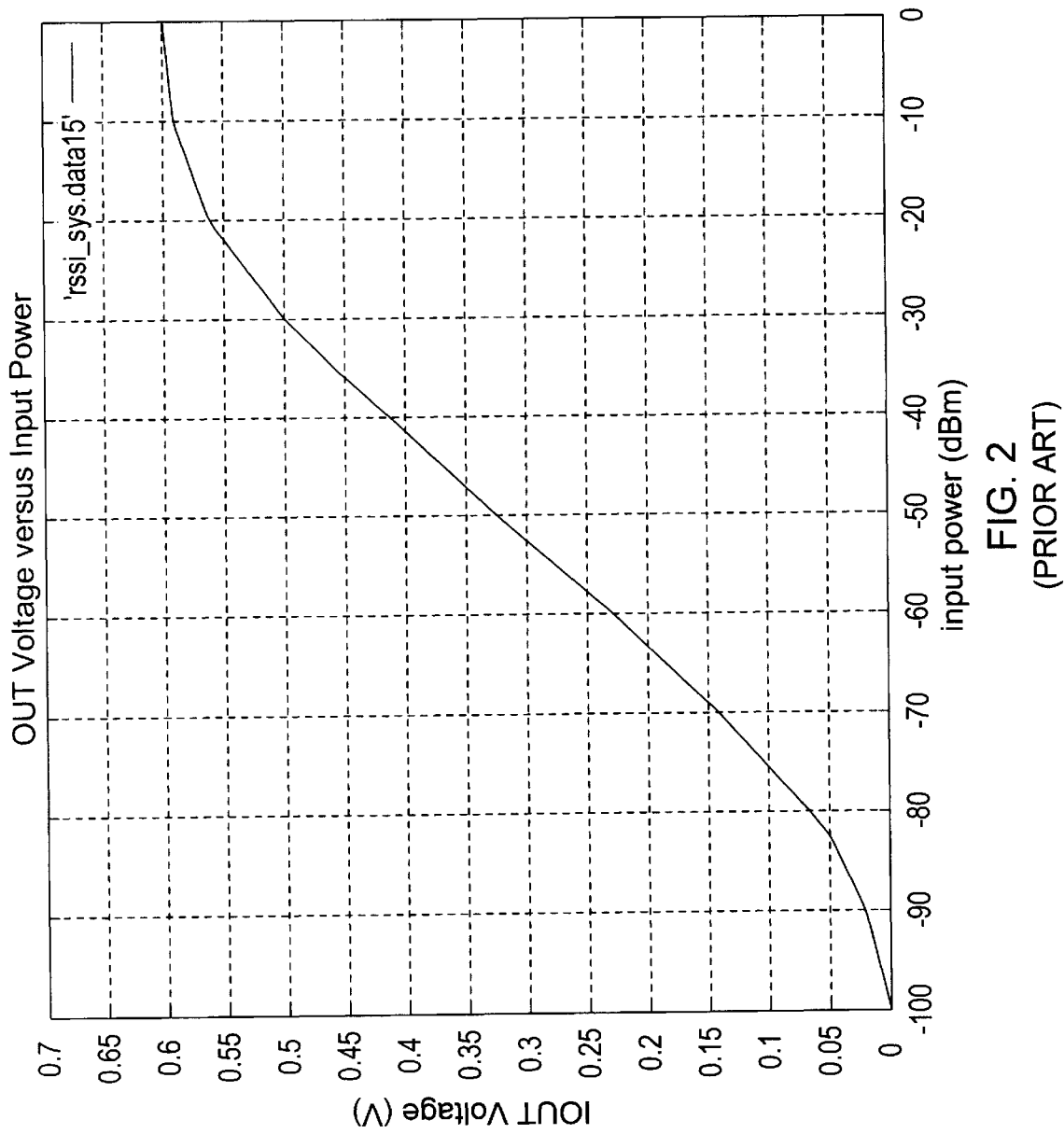
FIG. 2 is a graph that depicts the RSSI function as a function of input power.
Figure 3:
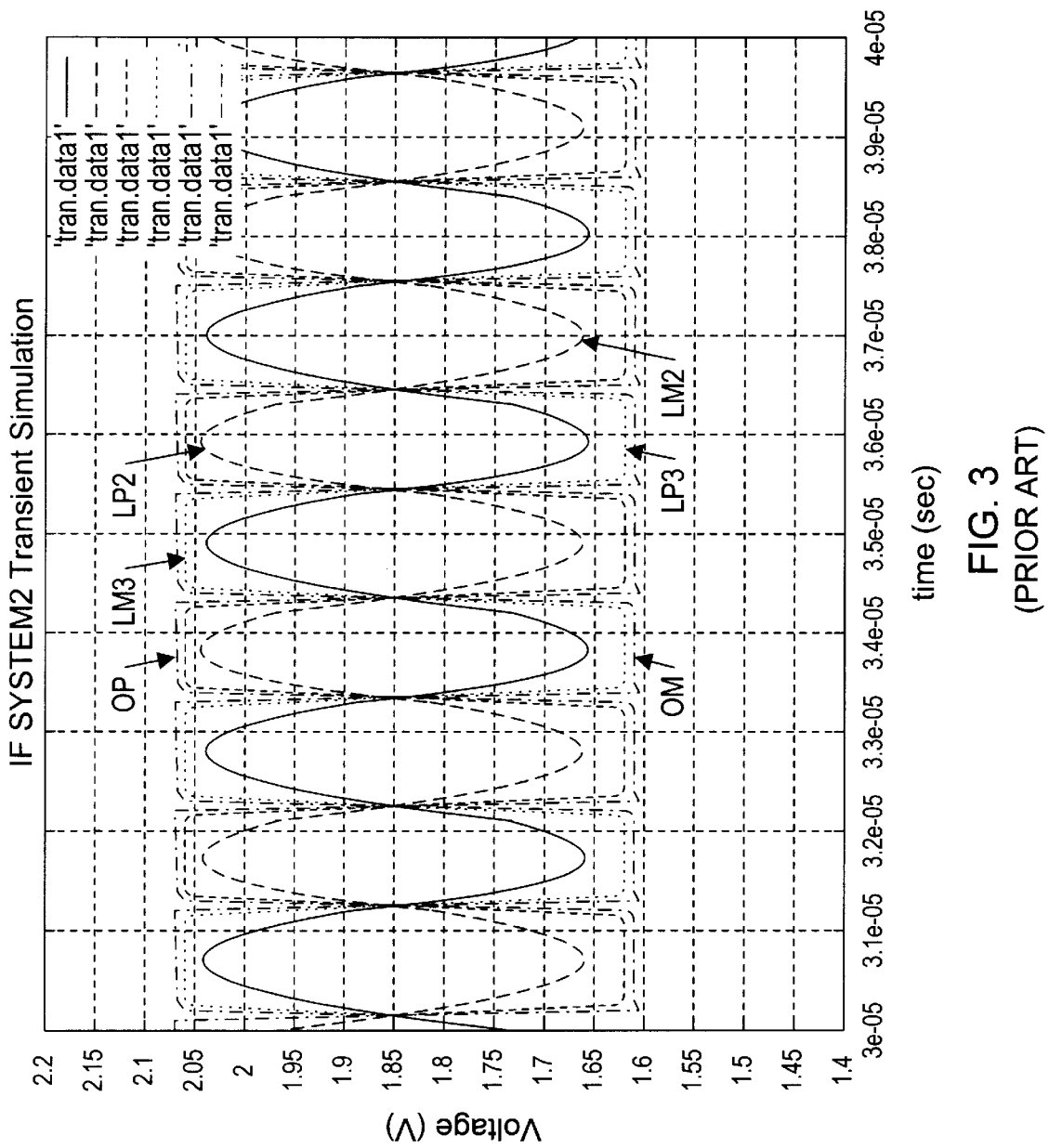
FIG. 3 is a graph that illustrates the transient response on the last three gain-stages of the IF signal path of the IF system of FIG. 1.
Figure 4:
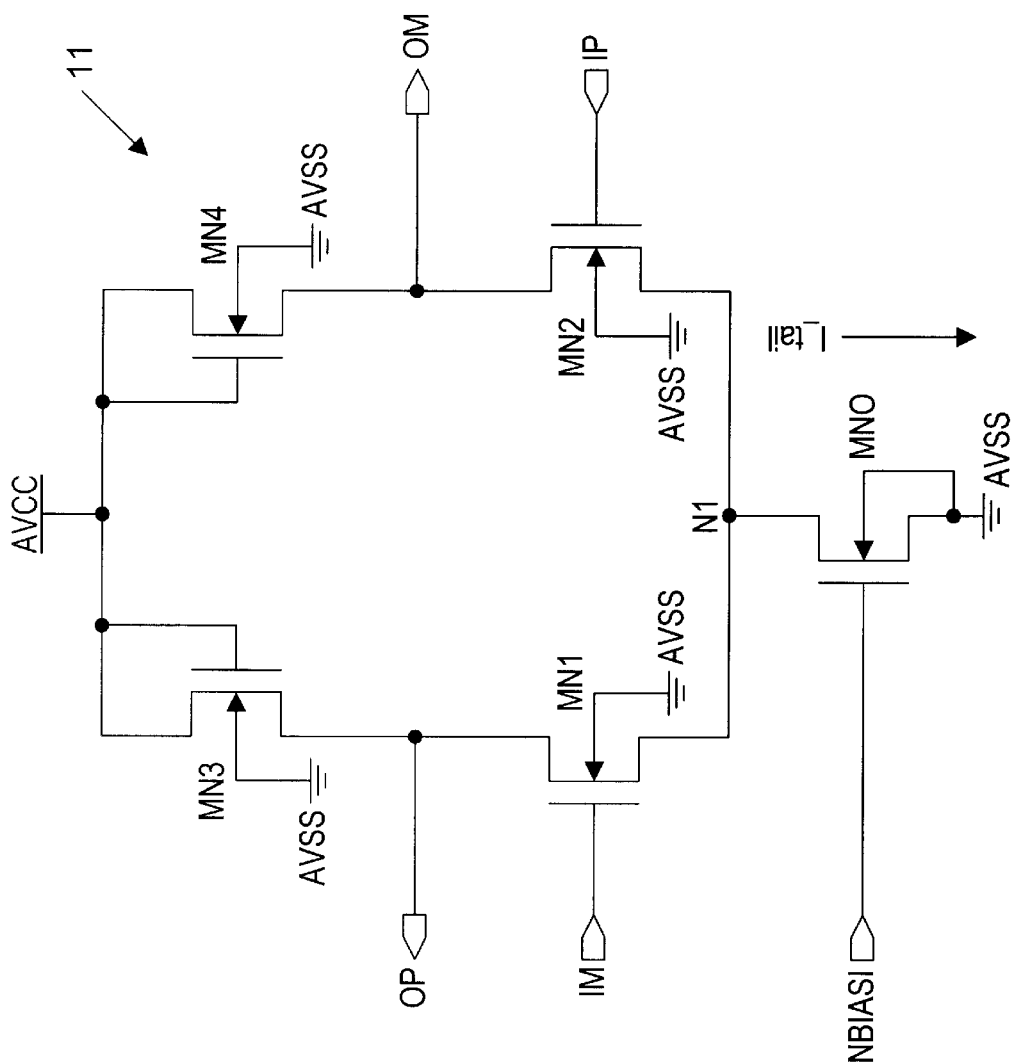
FIG. 4 is a schematic diagram that illustrates typical circuit for implementing a gain stage.
Figure 5:
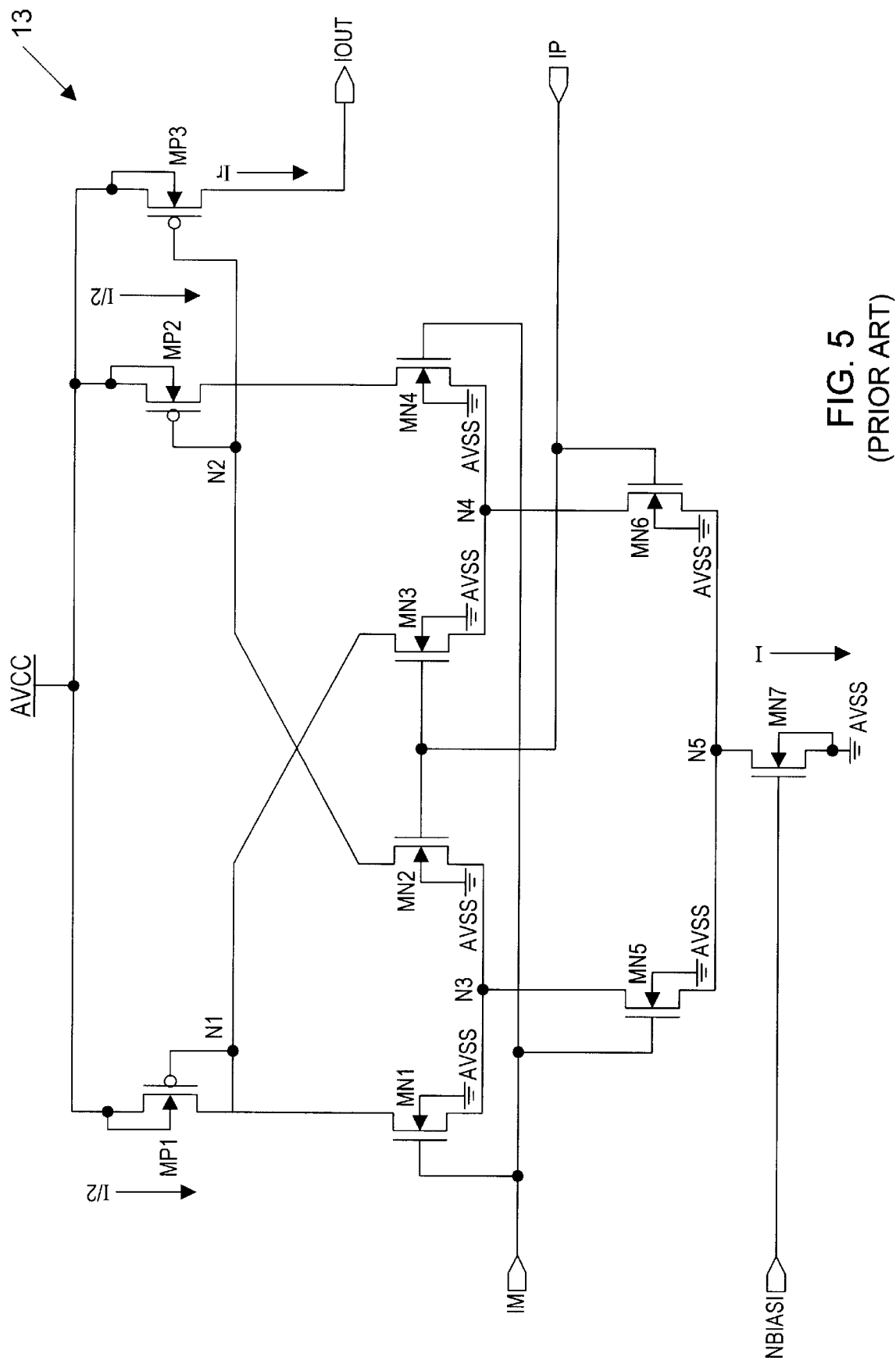
FIG. 5 is a schematic diagram that illustrates typical circuitry for implementing a rectifying stage.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 6:
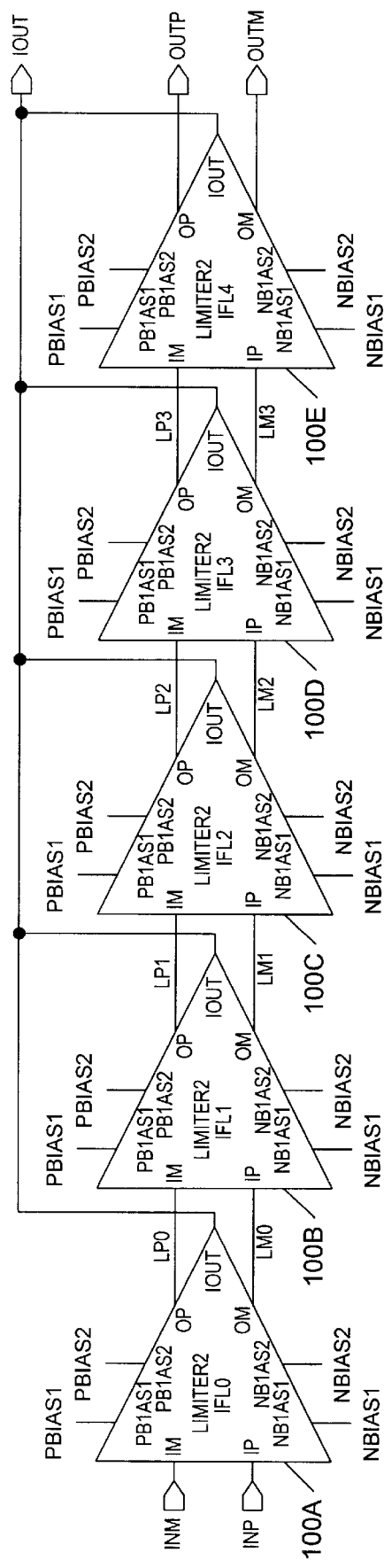
FIG. 6 is a block diagram of a sub-section of an IF system including a plurality of IF gain and rectifying stages in accordance with one embodiment of the present invention.

Turning now to FIG. 6, a block diagram of one embodiment of a sub-section of an IF system is shown. The IF system of FIG. 6 includes a plurality of IF gain and rectifying stages 100A–100E. A signal path gain function is formed between differential inputs INM and INP and differential outputs OUTP and OUTM. An RSSI (Receive Signal Strength Indicator) signal is further generated at a node IOUT which has a magnitude proportional to the amplitude of the differential input signal.

Figure 7:
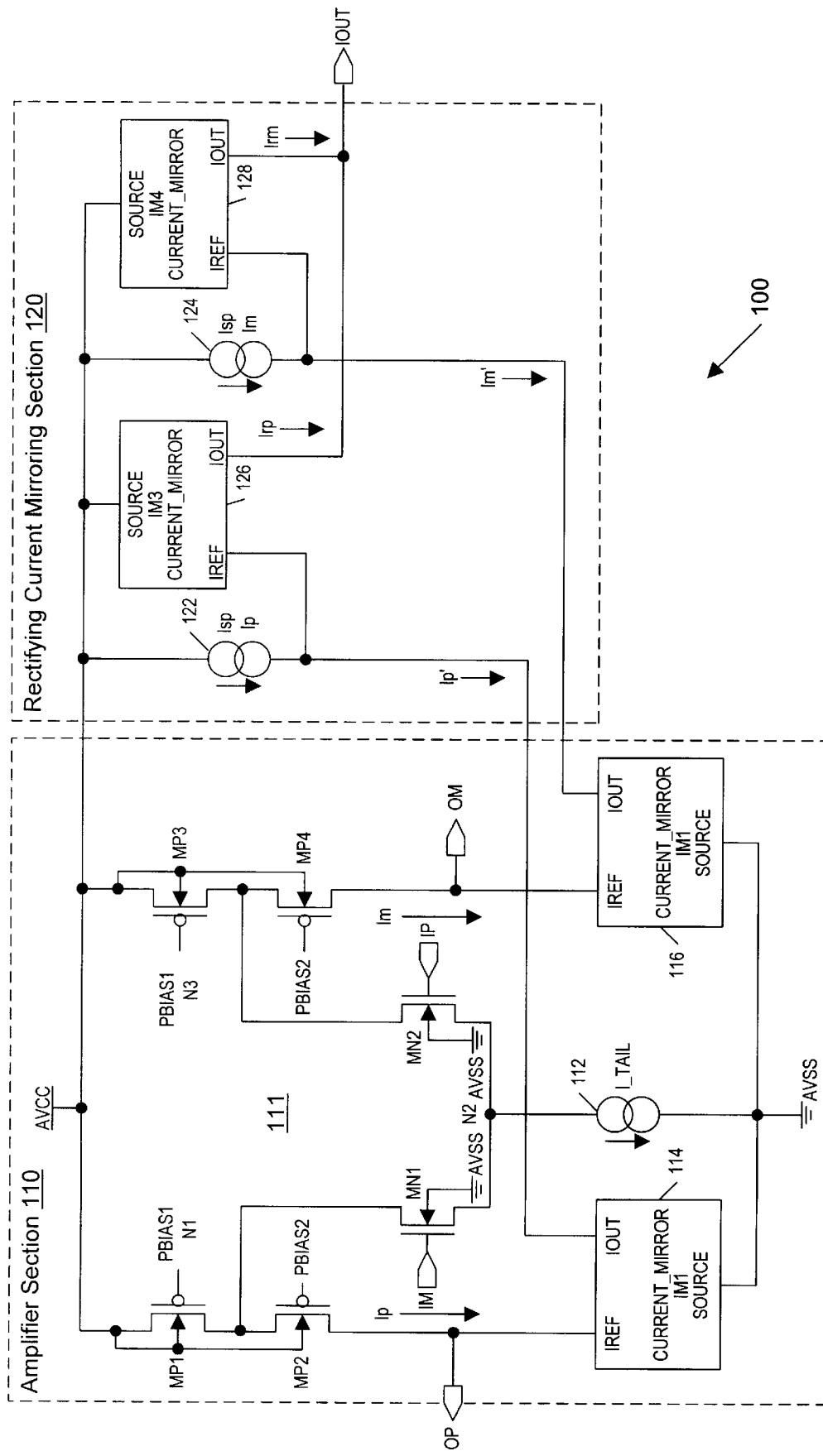
FIG. 7 is a block diagram that illustrates one embodiment of an IF gain and rectifying stage.

FIG. 7 is a block diagram of one embodiment of an IF gain and rectifying stage 100 employed within the IF system of FIG. 6. The IF gain and rectifying stage of FIG. 7 includes an amplifier section 110 and a rectifying current mirroring section 120. In this implementation, amplifier section 110 includes a high-swing folded-casecode amplifier structure 111 formed by transistors MP1–MP4, transistors MN1 and MN2, and a constant current sink 112. The high-swing folded-casecode structure 111 is terminated into two current mirrors 114 and 116 which form respective loads. The current mirror 114 generates a first mirrored signal Ip' which has a magnitude proportional to (or identical to) the current Ip through the first leg of the gain stage. Similarly, current mirror 116 generates a second mirrored signal Im' which has a magnitude proportional to (or identical to) the signal Im through the second leg of the gain-stage. The mirrored signals Ip' and Im' are provided to rectifying current mirroring section 120, as discussed further below.

The signal-path gain-stage functionality implemented by amplifier section 110 is quite simple. The high-swing folded-casecode structure 111 modulates the load currents Ip and Im by way of the input differential transistors MN1 and MN2. The load currents are converted into voltages via the loads formed by current mirrors 114 and 116. Thus, generally speaking, amplifier section 110 includes a first current path, formed by transistors MP1, MP2 and current mirror 114, through which a first current Ip flows. The first current path includes a load, which in this embodiment is formed by current mirror 114, thus producing an output voltage at output OP. Input transistor MN1 is coupled to the first current path and controls the current Ip depending upon input voltage IM. Similarly, a second current path is formed by transistors MP3, MP4 and current mirror 116, which forms a similar load. Input transistor MN2 is provided to allow control of the current Im flowing through the second current path depending upon the input voltage at input IP. It is noted that in other embodiments, the first and second current paths included within amplifier section 110 may be formed using alternative or additional circuitry or configurations. That is, other embodiments are possible wherein said first and second current paths flowing through output loads include respective current mirrors for mirroring and to rectifying current mirroring section 120.

The amplifier section 110 architecture may advantageously accommodate independent control of the input differential pair transconductance or gm, the output stage gm found in transistors MP2 and MP4, and the common-mode output voltage at OM and OP. The above features may allow AC and DC optimization, thus increasing the robustness and manufacturability.

The current rectification or RSSI function is implemented with the mirrored currents Ip' and Im' as generated by current mirrors 114 and 116, two current-sources 122 and 124, and two additional current-mirror circuits 126 and 128. The complete functionality of the current-rectifier mirroring section 120 of FIG. 7 can be described in the following current equations:

$$IOUT = Irm + Irp \quad (1)$$

$$Irp = Ip' - Isp \quad (2)$$

$$Irm = Im' - Ism \quad (3)$$

$$Ip' = Ip \quad (4)$$

$$Im' = Im \quad (5)$$

The first observation about the current rectification scheme is that current mirrors 126 and 128 are only current-source circuits; hence their capability is only sourcing current, not sinking current. Next, the operation of the rectifying function must be analyzed for a positive half-cycle, a negative half-cycle, and during the condition when no input signal is observed.

During the condition when no input signal is present, inputs IM and IP are at equivalent voltage potentials and load currents Ip and Im are equal. This results in the following current relationship:

$$Ip = Im \quad \text{from ideal condition}$$
$$Irp = Ip - Ip \quad \text{from equation (2) where } Isp = Ip \text{ and } Ip' = Ip$$
$$Irm = Im - Im \quad \text{from equation (3) where } Ism = Im \text{ and } Im' = Im$$
$$IOUT\ Im - Im + Ip - Ip = 0$$

During the positive-half input cycle, input IP is at a greater voltage potential than input IM and output load currents Ip and Im have the following values:

$$Ip = Ip + \text{delta}\_I$$
$$Im = Im - \text{delta}\_I$$

The following current relationships are now present:

$$Irp = Ip + \text{delta}\_I - Ip \quad \text{from equation (2) where } Isp = Ip \text{ and } Ip' = Ip$$
$$Irm = Im - \text{delta}\_I - Im \quad \text{from equation (3) where } Ism = Im \text{ and } Im' = Im$$

It is noted that since a current-source current-mirror can not have a negative value, the value of Irm will be zero. The positive-half cycle yields the following equation:

$$IOUT = Ip + \text{delta}\_I - Ip + 0$$
$$IOUT = \text{delta}\_I$$

During the negative-half input cycle, input IM is at a greater voltage potential then input IP and output load currents Ip and Im have the following values:

$$Ip = Ip - \text{delta}\_I$$
$$Im = Im + \text{delta}\_I$$

The negative-half cycle has a similar function to the positive-half cycle but with current source 126 having a value of zero and current source 128 sourcing a delta_I current. The negative-have cycle thus yields the following equation for IOUT:

$$IOUT = 0 + Im + \text{delta}\_I - Im$$
$$IOUT = \text{delta}\_I$$

Accordingly, it may be appreciated that current mirror 126 is provided to generate an output current which represents a difference between the current Ip' and the constant current provided by constant current source 122 during positive half-cycles. Similarly, current mirror 128 is provided to generate an output current having a magnitude equal to the difference between the current Im' and the current of constant current source 124 during negative half-cycles.

Figure 8:
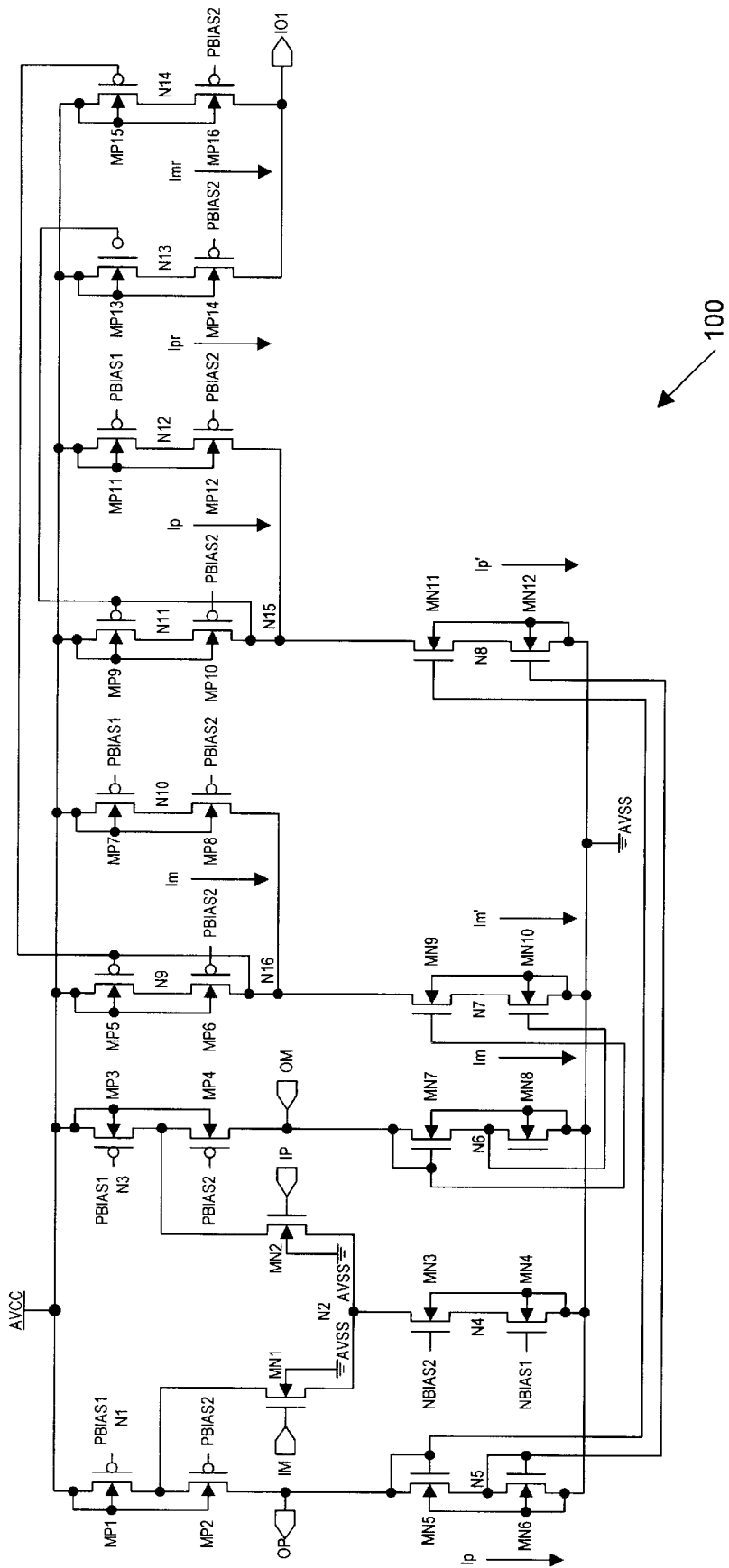
FIG. 8 is a schematic diagram that illustrates one implementation of an IF gain and rectifying stage.

FIG. 8 schematically illustrates one implementation of the IF gain and rectifying stage 100 of FIG. 7. Circuit portions that correspond to those of FIG. 7 are numbered identically for simplicity and clarity. NBIAS1, NBIAS2, PBIAS1, and PBIAS2 are all bias voltage for the n-channel and p-channel devices respectively. Transistors MN5, MN7, MN9, and MN11 are natural transistors with a lower threshold voltage than enhancement transistors, and MN1, MN2, MN3, MN4, MN6, M8, MN10, and MN12 are n-channel enhancement transistors. The low threshold voltages provided by transistors MN5, MN7, MN9, and MN11 allow the voltages at the drains of transistors MP2, MP4, MP6 and MP10 to remain relatively low with higher values of signal path current. It is noted that other implementations of the architecture of FIG. 7 may also function using other MOS device types and/or other current-mirror and constant current source implementations.

Numerous variations and modifications will become apparent to those skilled in the art once the above disclosure is fully appreciated. It is intended that the following claims be interpreted to embrace all such variations and modifications.

What is claimed is:

1. An intermediate frequency circuit comprising:

a signal amplifier stage for amplifying a differential input signal, wherein said signal amplifier stage includes:

a first current path and a second current path whereby a differential output signal is derived from a respective node along each of said first and second current paths;

a first current mirror coupled to said first current path and configured to generate a first mirrored signal having a current proportional to a current of said first current path; and a second current mirror coupled to said second current path and configured to generate a second mirrored signal having a current proportional to a current of said second current path; and a rectifying current mirroring stage for generating a rectified output signal proportional to an amplitude of said differential input signal, wherein said rectifying current mirroring stage includes:

a first constant current source for generating a first constant current;

a third current mirror coupled to said first current mirror and to said first constant current source, wherein said third current mirror is configured to generate a third mirrored signal having a magnitude proportional to a difference between said first mirrored signal and said first constant current;

a second constant current source for generating a second constant current; and a fourth current mirror coupled to said second current mirror and to said second constant current source, wherein said fourth current mirror is configured to generate a fourth mirrored signal having a magnitude proportional to a difference between said second mirrored signal and said second constant current, whereby said rectified output signal of said rectifying current mirroring stage is derived by combining said third mirrored signal and said fourth mirrored signal.

2. The intermediate frequency circuit as recited in claim 1 wherein said signal amplifier stage further includes:

a first input transistor for receiving a first side of a differential input signal and configured to vary said current of said first current path depending upon said first side of said differential input signal; and a second input transistor for receiving a second side of said differential input signal, wherein said second input transistor is configured to vary said current of said second current path depending upon said second side of said differential input signal.

3. The intermediate frequency circuit as recited in claim 1 wherein said third current mirror generates said third mirrored signal only when a magnitude of current of said first mirrored signal is greater than said first constant current.

4. The intermediate frequency circuit as recited in claim 3 wherein said fourth current mirror generates said fourth mirrored signal only when a magnitude of current of said second mirrored signal is greater than said second current source.

5. The intermediate frequency circuit as recited in claim 4 wherein said signal amplifier stage further includes:

a first input transistor coupled to said first current path and configured to vary said current of said current path depending upon a first side of a differential input signal; and a second input transistor coupled to said second current path, wherein said second input transistors configured to vary said current of said second current path depending upon a second side of said differential input signal.

6. The intermediate frequency circuit as recited in claim 5 further comprising a constant current sink coupled between said first and second input transistors and a reference voltage.

7. The intermediate frequency circuit as recited in claim 6 wherein said constant current sink is coupled to a drain of said first input transistor and to a drain of said second input transistor.

8. The intermediate frequency circuit as recited in claim 5 wherein said first current mirror includes a transistor coupled to said current path which has a threshold voltage less than a threshold voltage of said first input transistor.

9. The intermediate frequency circuit as recited in claim 1 wherein said signal amplifier stage is configured in a casecoded configuration.

\* \* \* \* \*